United States Patent
Chuang et al.

(10) Patent No.: US 9,166,003 B2
(45) Date of Patent: Oct. 20, 2015

(54) LAYOUT CONFIGURATION FOR MEMORY CELL ARRAY

(71) Applicant: UNITED MICROELECTRONICS CORP., Hsin-Chu (TW)

(72) Inventors: Meng-Ping Chuang, Hsinchu (TW); Yu-Tse Kuo, Tainan (TW); Chia-Chun Sun, Taipei (TW); Yun-San Huang, New Taipei (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 28 days.

(21) Appl. No.: 14/062,914

(22) Filed: Oct. 25, 2013

(65) Prior Publication Data
US 2014/0035111 A1 Feb. 6, 2014

Related U.S. Application Data

(63) Continuation of application No. 13/287,141, filed on Nov. 2, 2011, now Pat. No. 8,614,463.

(51) Int. Cl.
- *H01L 29/06* (2006.01)
- *H01L 27/02* (2006.01)
- *H01L 27/11* (2006.01)

(52) U.S. Cl.
CPC ........ *H01L 29/0692* (2013.01); *H01L 27/0207* (2013.01); *H01L 27/1104* (2013.01); *H01L 29/0684* (2013.01)

(58) Field of Classification Search
CPC ............ H01L 29/0692; H01L 29/0684; H01L 27/1104
See application file for complete search history.

(56) References Cited

U.S. PATENT DOCUMENTS

| | | |
|---|---|---|
| 4,406,710 A | 9/1983 | Davies |
| 6,049,113 A | 4/2000 | Shida |
| 2006/0261400 A1 | 11/2006 | Sudo |

*Primary Examiner* — Amar Movva
(74) *Attorney, Agent, or Firm* — Winston Hsu; Scott Margo

(57) ABSTRACT

A layout configuration for a memory cell array includes at least a comb-like doped region having a first conductivity type and a fishbone-shaped doped region having a second conductivity type. The second conductivity type and the first conductivity type are complementary. Furthermore, the comb-like doped region and the fishbone-shaped doped region are interdigitated.

9 Claims, 7 Drawing Sheets

LAYOUT CONFIGURATION FOR MEMORY CELL ARRAY

CROSS REFERENCE TO RELATED APPLICATIONS

This is a continuation application of U.S. patent application Ser. No. 13/287,141, filed on Nov. 2, 2011, and all benefits of such earlier application are hereby claimed for this new continuation application.

BACKGROUND OF THE INVENTION

1. Field of the Invention

The present invention generally relates to a layout configuration for a memory cell array, and more particularly, to a layout configuration for a static random access memory (hereinafter abbreviated as SRAM) array.

2. Description of the Prior Art

In recent years, with widespread used of mobile terminal equipment, digital signal processing in which bulk data such as sounds or images is processed at high speed has been increasingly important. SRAM, which is capable of high-speed access processing holds an important place as a semiconductor memory device to be mounted on such mobile terminal equipment.

Please refer to FIG. 1, which is a plan view of a conventional memory cell layout configuration of a 6T-SRAM. The memory cell 100 includes four n-channel metal-oxide-semiconductor (MOS) transistors 106/108/110/112 formed in heavily-doped p-type ($P^+$) regions 120 and two p-channel MOS transistors 102/104 formed in a heavily-doped n-type ($N^+$) region 122.

Please refer to FIG. 2, which is a plan view of a conventional memory cell array layout configuration of the SRAM. As shown in FIG. 2, each memory cell 100, which is indicated as an area enclosed by a dotted line is formed on the $P^+$ regions 120 and the $N^+$ region 122 between the two adjacent $P^+$ regions 120. It should be noted that the $P^+$ regions 120 and the $N^+$ regions 122 are all indicated as areas enclosed by thin solid lines. Furthermore, a row of strapping cells (not shown) are positioned between two rows of the memory cells 100 for power feeding. The strapping cells include a plurality of $P^+$ regions 130 and a plurality of $N^+$ regions 132, which are indicated as areas enclosed by thick solid lines. The $P^+$ regions 130 are formed simultaneously with the $P^+$ regions 120 and the $N^+$ regions 132 are formed simultaneously with the $N^+$ regions 122. As shown in FIG. 2, the $P^+$ regions 130 and the $N^+$ regions 122 in a same column are alternately arranged. In the same concept, the $N^+$ regions 132 and the $P^+$ regions 120 in a same column are alternately arranged. Furthermore, the $P^+$ regions 130 and the $N^+$ regions 132 in the same row are alternately arranged.

Additionally, a plurality of diffusion regions (not shown) respectively serving as the source/drain regions of the n-channel MOS transistors and the p-channel MOS transistors are formed in the $P^+$ regions 120 and the $N^+$ regions 122. Also a plurality of diffusion regions 140 is respectively formed in the $P^+$ regions 130 and the $N^+$ regions 132. As shown in FIG. 2, the diffusion regions 140 is completely encompassed by the $P^+$ regions 130 and the $N^+$ regions 132.

It is noteworthy that with a trend toward higher integration of integrated circuit, semiconductor devices such as the memory cells 100 keep shrinking. However, it is found that the memory cell array 200 cannot be shrunk as expected. It is noteworthy that in the prior art memory cell array 200, the $P^+$ regions 120, the $N^+$ regions 122, the $P^+$ regions 130, and the $N^+$ regions 132 are all islanding configurations. Furthermore, the $P^+$ region 130 must be kept from the corner of the $P^+$ regions 120 by a spacing distance $d_1$ which satisfies with the topological layout rules (TLR), and the $N^+$ region 132 must be kept from the corner of the $N^+$ regions 122 by a spacing distance $d_2$ which satisfies with the TLR. In other words, the spacing distances $d_1$ and $d_2$ cannot be reduced in order to be compliant with the fabricator's TLR, and thus the size of the memory cell array 200 cannot be shrunk. Not only the spacing distances $d_1$ and $d_2$ cannot be reduced, but also the size of the $P^+$ regions 130 and the $N^+$ regions 132 cannot be shrunk due to optical limitations. Furthermore, it is found that the layout configuration of the conventional memory cell array 200 has many TLR design rule check (DRC) violation and causes many risks such as incomplete opening in masking layer for forming the $P^+$ regions 130, the $N^+$ regions 132, and even the diffusion regions 140, and causes inferior implantation result. As such, a layout configuration allowing memory cell array shrinking is still in need.

SUMMARY OF THE INVENTION

According to an aspect of the present invention, a layout configuration for a memory cell array is provided. The layout configuration includes at least a comb-like doped region having a first conductivity type and a fishbone-shaped doped region having a second conductivity type. The second conductivity type and the first conductivity type are complementary. More important, the comb-like doped region and the fishbone-shaped doped region are interdigitated.

According to another aspect of the present invention, a layout configuration for a memory cell array is provided. The layout configuration for a memory cell array includes a top area, a bottom area, and a plurality of gap areas defined in between the top area and the bottom area; a pair of comb-like doped regions having a first conductivity type respectively formed in the top area and the bottom area; at least a first fishbone-shaped doped region having a second conductivity type formed in the gap areas; and at least a second fishbone-shaped doped region having the first conductivity type formed in the gap areas. The second conductivity type and the first conductivity type are complementary According to the layout configurations for a memory cell array provided by the present invention, the comb-like doped regions and the fishbone-shaped regions in which the memory cells and the strap cell are formed are provided. Specifically speaking, the strap cells are formed in the base portions of the comb-like doped regions and the stem-like portions of the fishbone-shaped doped regions while the memory cells are formed in the tooth portions of the comb-like doped regions and the branch-like portions of the fishbone-shaped regions. Therefore no spacing distance is needed between the doped regions for forming the strap cells and the doped regions for forming the memory cells. Accordingly the memory cell array provided by the present invention can be shrunk as expected.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
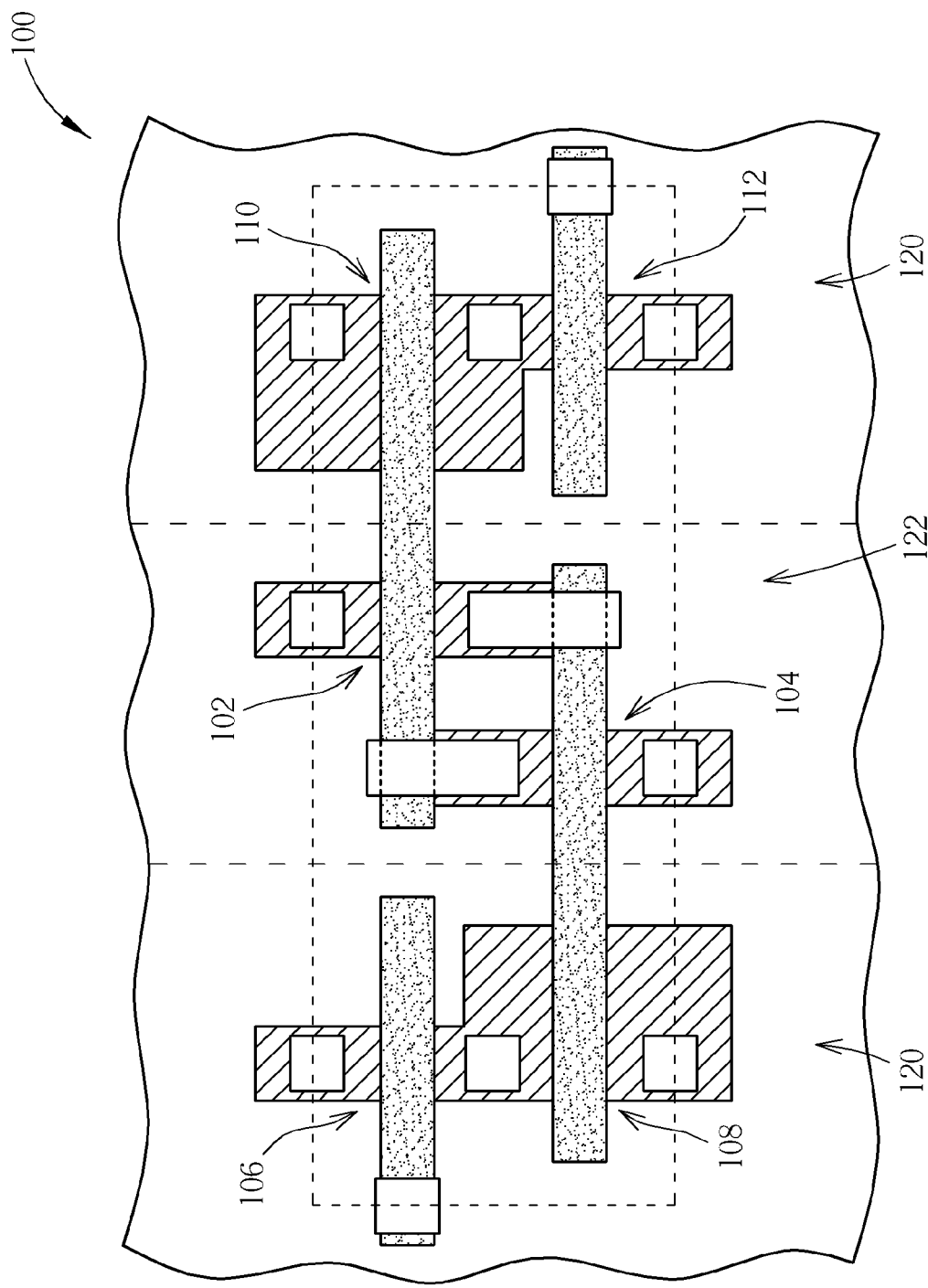
FIG. 1 is a plan view of a conventional memory cell layout of a 6T-SRAM.
Figure 2:
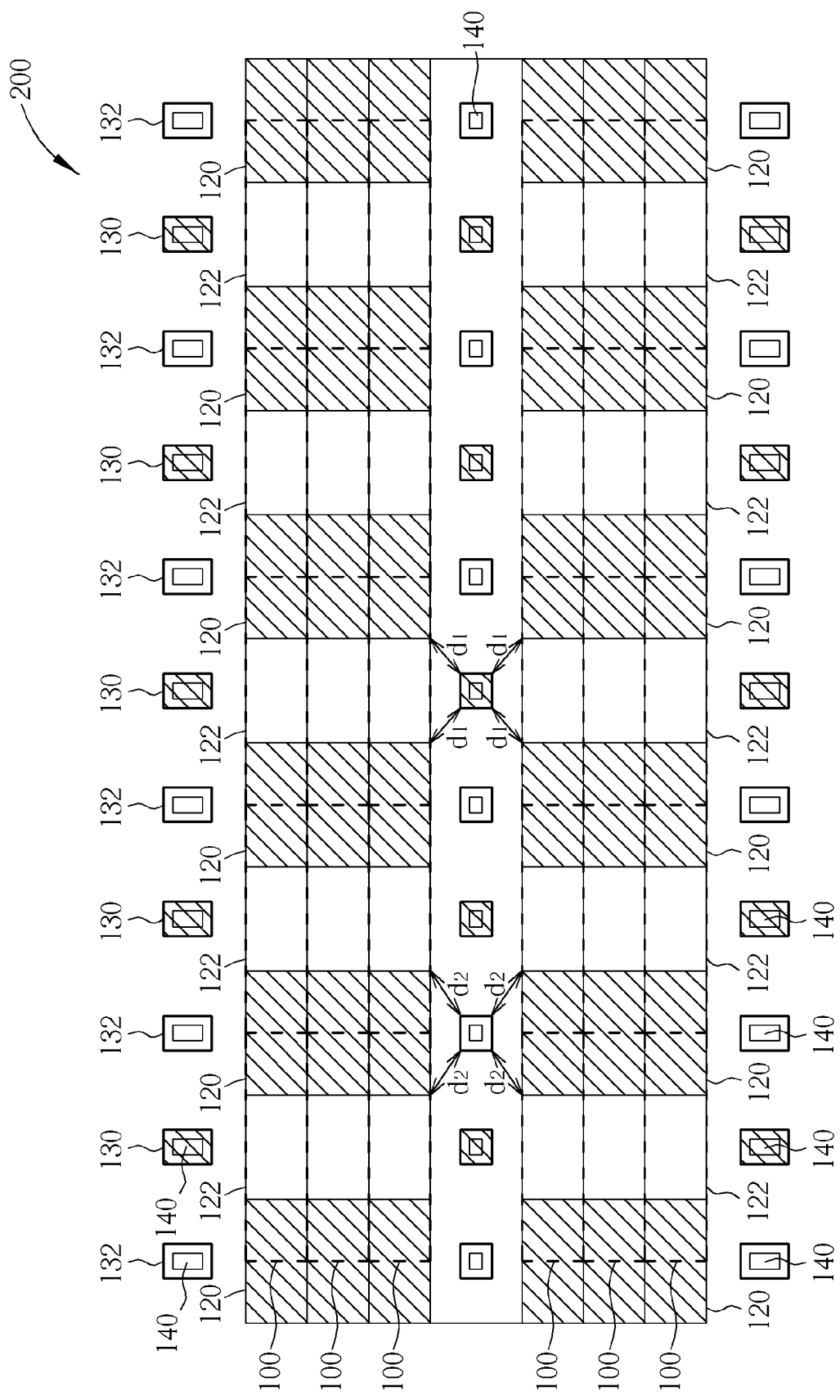
FIG. 2 is a plan view of a conventional memory cell array layout of the SRAM.
Figure 3:
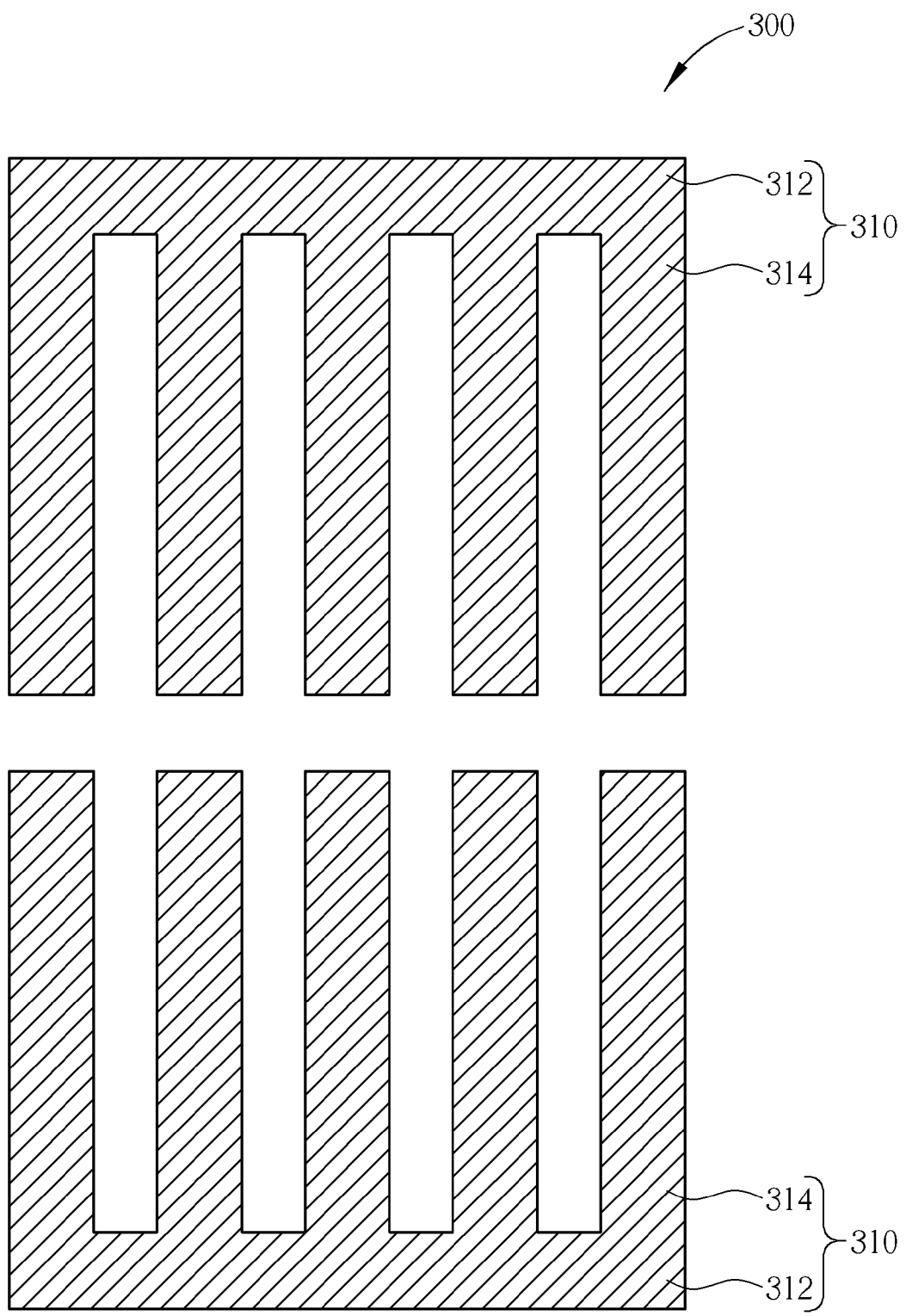
FIG. 3 is a decomposition view of a layout configuration for a memory cell array provided by a first preferred embodiment of the present invention.
Figure 4:
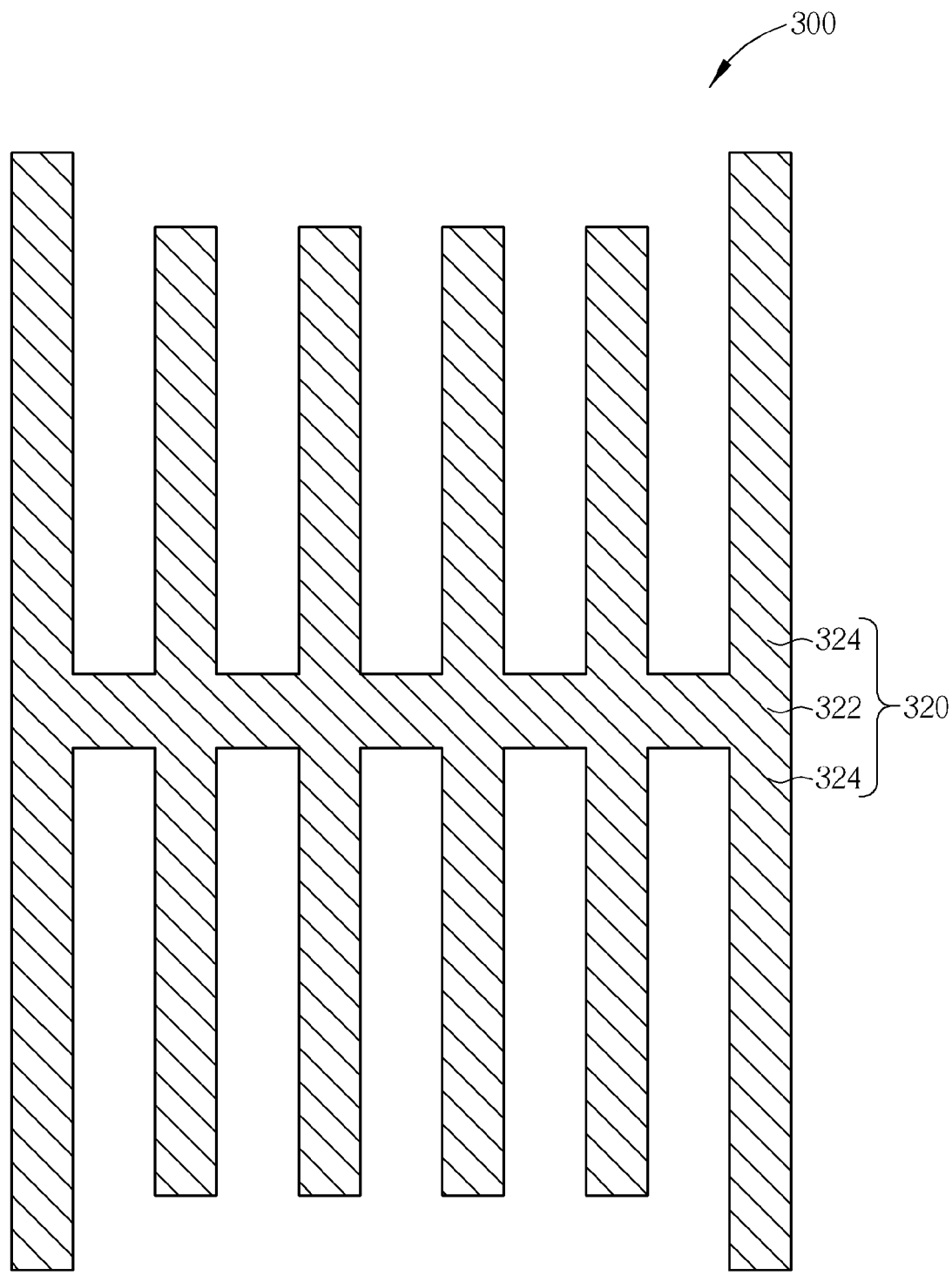
FIG. 4 is another decomposition view of the layout configuration for a memory cell array provided by the first preferred embodiment.
Figure 5:
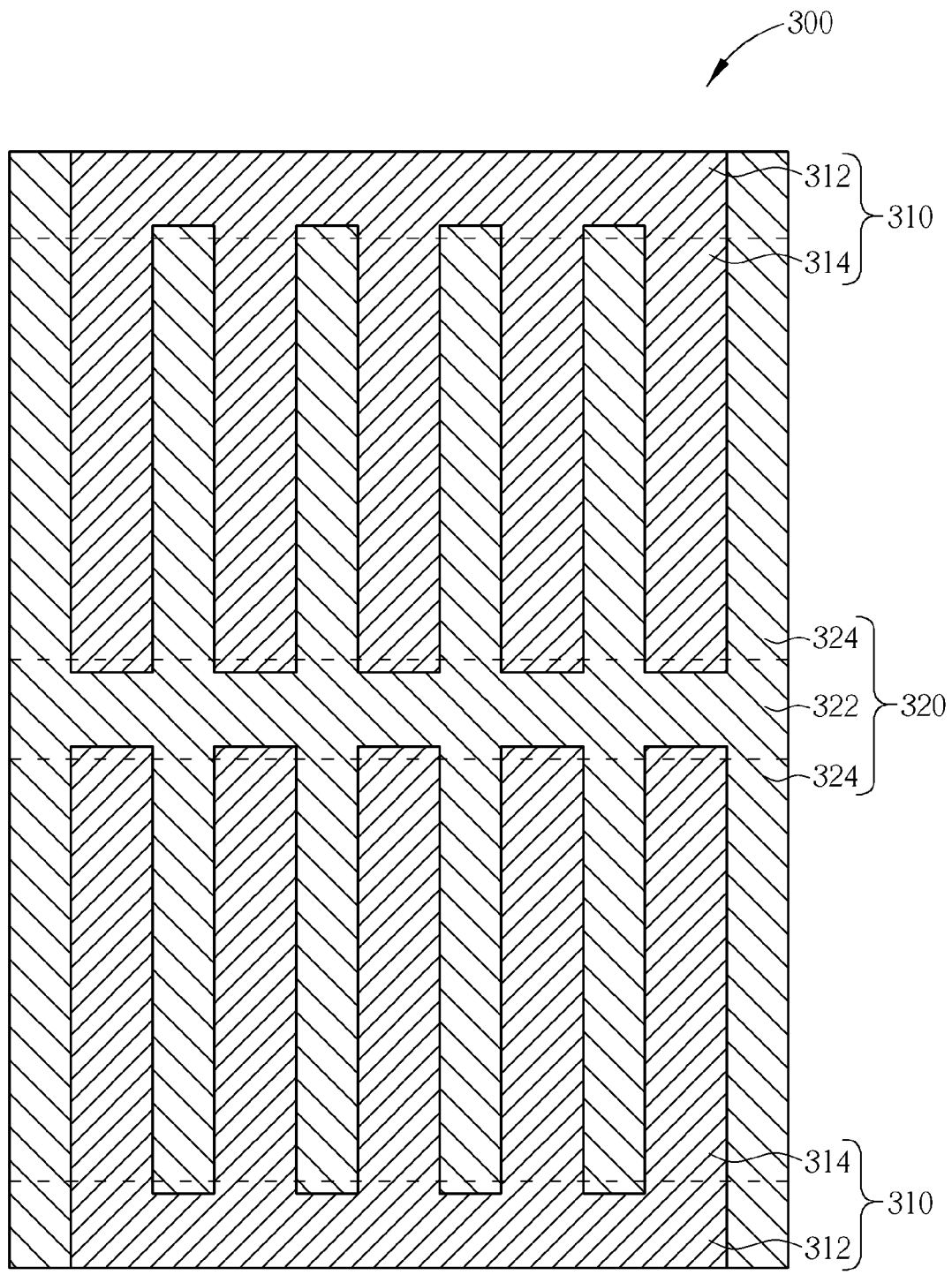
FIG. 5 is still another decomposition view of the layout configuration for a memory cell array provided by the first preferred embodiment.
Figure 6:
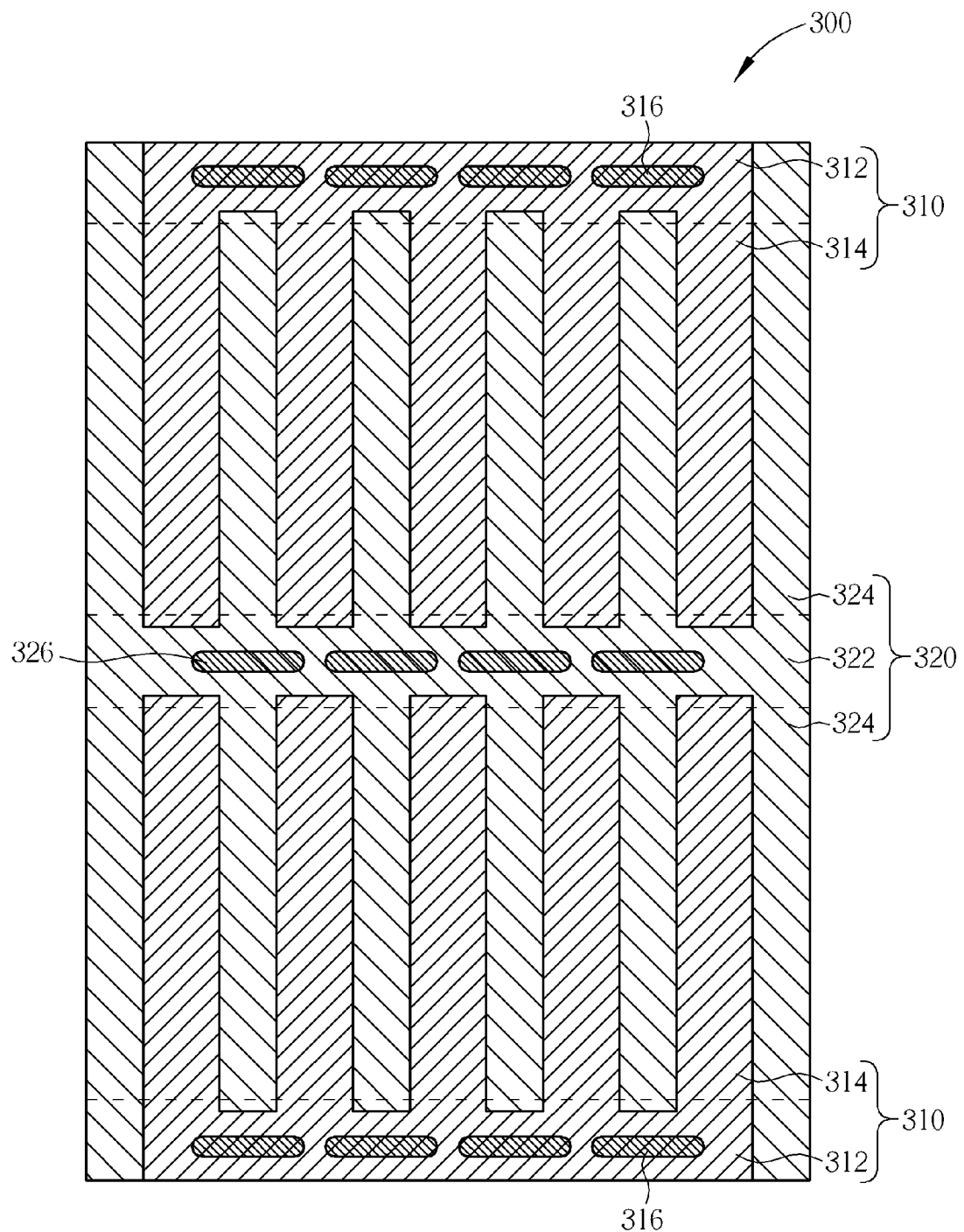
FIG. 6 is a schematic plan view of the layout configuration for a memory cell array provided by the first preferred embodiment.

Please refer to FIGS. 3-6, wherein FIG. 3 is a decomposition view of a layout configuration for a memory cell array provided by a first preferred embodiment of the present invention, FIG. 4 is another decomposition view of the layout configuration for a memory cell array provided by the first preferred embodiment, FIG. 5 is still another decomposition view of the layout configuration for a memory cell array provided by the first preferred embodiment, and FIG. 6 is a schematic plan view of the layout configuration provided by the first preferred embodiment.

As shown in FIG. 3, the layout configuration 300 for a memory cell array provided by the preferred embodiment includes at least a comb-like doped region 310, preferably a pair of comb-like doped regions 310, having a first conductivity type. The comb-like doped region 310 includes a base portion 312 and a plurality of tooth portions 314. The base portion 312 extends along a first direction while the tooth portions 314 extend along a second direction. In this preferred embodiment, the first direction and the second direction are perpendicular to each other.

Please refer to FIG. 4. The layout configuration 300 for a memory cell array provided by the preferred embodiment also includes a fishbone-shaped doped region 320 having a second conductivity type. The second conductivity type and the first conductivity type are complementary. In this preferred embodiment, the first conductivity type is p type and the second conductivity type is n type. The fishbone-shaped doped region 320 includes a stem-like portion 322 and a plurality of branch-like portions 324 while the branch-like portions 324 are symmetrical about the stem-like portion 322. The stem-like portion 322 extends along the first direction and the branch-like portions 324 extend along the second direction.

Please refer to FIG. 5. Please note that the comb-like doped regions 310 are filled with slash ("/") pattern and the fishbone-shaped doped region 320 is filled with backslash ("\") pattern for differentiating from each other and emphasizing. As shown in FIG. 5, the comb-like doped regions 310 and the fishbone-shaped doped region 320 are interdigitated. Specifically speaking, the tooth portions 314 of the comb-like doped region 310 and the branch-like portions 324 of the fishbone-shaped doped region 320 are interdigitated. In other words, the tooth portions 314 and the branch-like portions 324 are alternately arranged. Additionally, the base portions 312 of the comb-like doped regions 310 and the stem-like portion 322 of the fishbone-shaped doped region 320 are parallel with each other. It is noteworthy that the branch-like portions 324 of the fishbone-shaped doped region 320 and the tooth portions 314 of the comb-like doped region 310 are the places where the memory cells (not shown) are to be formed. As mentioned above, a memory cell includes two p-channel MOS transistors (now shown) formed in the branch-like portions 324 of the fishbone-shaped doped region 320 and four n-channel MOS transistors (not shown) formed in the tooth portions 314 of the comb-like doped regions 310.

Additionally, a plurality of n-type diffusion regions (not shown) respectively serving as the source/drain regions of the n-channel MOS transistor device is formed in the tooth portions 314 of the comb-like doped region 310 and a plurality of p-type diffusion regions (not shown) respectively serving as the source/drain regions of the p-channel MOS transistor device is formed in the branch portions 324 of the fishbone-shaped doped region 320. Though those diffusion regions are omitted for simplifying the drawings and avoiding confusion, those skilled in the art should easily realize that those diffusion regions cannot be ignored from the memory array.

Please refer to FIG. 6. The layout configuration 300 provided by the preferred embodiment further includes a plurality of first diffusion regions 316 formed in the base portion 312 of the comb-like doped region 310. The layout configuration 300 also includes a plurality of second diffusion regions 326 formed in the stem-like portion 322 of the fishbone-shaped doped region 320. The first diffusion regions 316 and the second diffusion regions 326 are all indicated as an area enclosed by a dotted line. The first diffusion regions 316 include the second conductivity and the second diffusion regions 326 include the first conductivity. It is noteworthy that the strap cells, which are provided for power feeding, include the first diffusion regions 316 for the n-channel MOS transistor device and the second diffusion regions 326 for the p-channel MOS transistor device.

According to the layout configuration for a memory cell array provided by the present invention, the doped regions in which the memory cells are produced and the doped regions in which the strap cells are produced are no longer islanding configurations. Instead, the doped regions having the same conductivity type are formed as a continuous configuration, such as the comb-like doped regions 310 and the fishbone-shaped doped region 320. Specifically speaking, the strap cells are formed in the base portions 312 of the comb-like doped regions 310 and the stem-like portion 322 of the fishbone-shaped doped region 320 while the memory cells are formed in the tooth portions 314 of the comb-like doped regions 310 and the branch-like portions 324 of the fishbone-shaped regions 320. Consequently, no spacing distance is needed anymore. Accordingly the memory cell array 300 provided by the present invention can be shrunk as expected.

Secondly, it is well-known that diffusion regions must be formed within the islanding doped regions in the prior art, and thus the size of the diffusion regions is limited by the conventional islanding doped regions and cannot be enlarged for improving implantation result. As a countermeasure against to this problem, the diffusion regions 316 of the preferred embodiment are formed in the base portions 314 of the comb-like doped region 310 and diffusion regions 326 of the preferred embodiment are formed in the stem-like portion 322 of the fishbone-shaped doped region 320. It is observed that the diffusion regions 316 and 326 are formed in the continuous configurations without spacing distance required. Thus the size of the diffusion regions 316 and 326 can be enlarged as shown in FIG. 6. Additionally, a shape of the diffusion regions 316 and 326 can be a rectangle with its long sides parallel with the extending direction of the base portions 312 of the comb-like doped region 310 and the stem-like portion 322 of the fishbone-shaped doped region 320, but not limited to this. Consequently, when forming the masking layer having openings for defining the diffusion regions 316 and 326, the openings are formed with superior profile since the designed diffusion regions 316/326 are enlarged. Therefore, ion implantation results for forming the diffusion regions 316 and 326 are improved.

Figure 7:
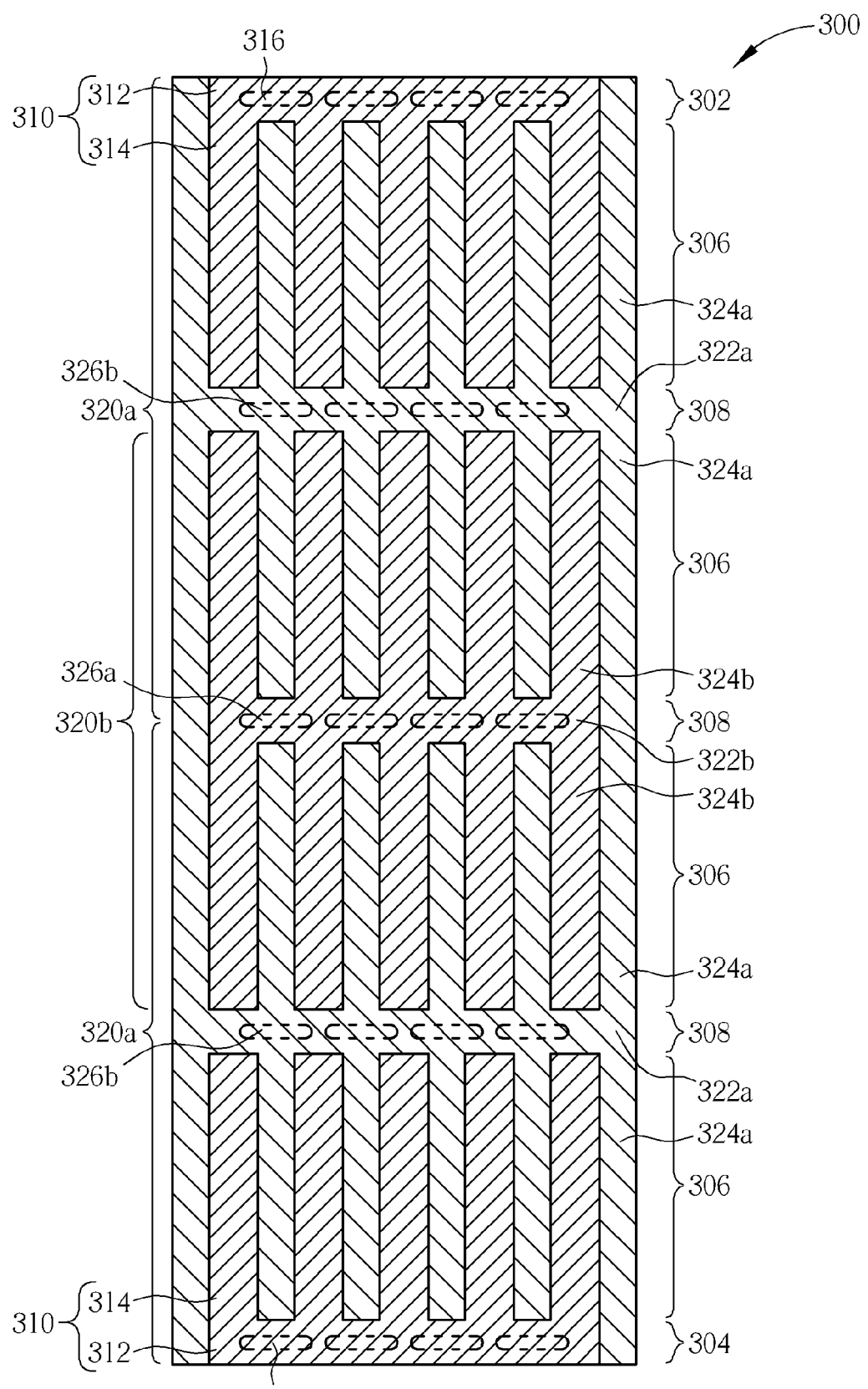
FIG. 7 is a schematic plan view of the layout configuration for a memory cell array provided by a second preferred embodiment of the present invention.

Please refer to FIG. 7, which is a schematic plan view of a layout configuration for a memory cell array provided by a second preferred embodiment. Please note that elements the same in both of the first and second preferred embodiments are designated by the same numerals. The layout configuration 300 for a memory cell array provided by the preferred embodiment includes a top area 302, a bottom area 304, and a plurality of memory cell areas 306 defined between the top area 302 and the bottom area 304. More important, the layout configuration 300 further includes a plurality of gap areas 308 defined between the top area 302 and the bottom area, particularly between the memory cell areas 306. In other words, the memory cell areas 306 are interrupted by the gap areas 308 as shown in FIG. 7. It should be easily realized that the amounts of the memory cell areas 306 and the gap areas 308 can be repeated any number of times to feed the needs. Although not shown in the figures, it will be appreciated by those of ordinary skill in the art that a plurality of memory cells are arranged in matrix in each of the memory cell areas 306. Since the arrangement of the memory cells are well-known to those skilled in the art, the memory cells formed in the memory cell areas 306 are all omitted for simplicity.

Please refer to FIG. 7 again. The layout configuration 300 for a memory cell array provided by the preferred embodiment also includes a pair of comb-like doped regions 310 having a first conductivity type respectively formed in the top area 302 and the bottom area 304. Each of the comb-like doped regions 310 includes a base portion 312 and a plurality of tooth portions 314. As shown in FIG. 7, the comb-like doped regions 310 in one pair are mirror symmetric to each other, therefore the base portion 312 of one comb-like doped region 310 is formed in the top area 302 and base portion 312 of the other comb-like doped region 310 is formed in the bottom area 304. Additionally, the tooth portions 314 of the pair of the comb-like doped regions 310 extend into the memory cell areas 306, and the memory cells are formed in the tooth portions 314 of the comb-like doped regions 310.

The layout configuration 300 for a memory cell array of the preferred embodiment also includes a plurality of first fishbone-shaped doped regions 320a and a plurality of second fishbone-shaped doped region 320b. The first fishbone-shaped doped region 320a includes a second conductivity type while the second fishbone-shaped doped region 320b includes the first conductivity type. The second conductivity type and the first conductivity type are complementary. In this preferred embodiment, the first conductivity type is a p type and the second conductivity type is an n type. As shown in FIG. 7, at least two first fishbone-shaped doped regions 320a are adjacent to the pair of the comb-like doped regions 310. The first fishbone-shaped doped regions 320a and the comb-like doped regions 310 are interdigitated. Also, the first fishbone-shaped doped regions 320a and the second fishbone-shaped doped regions 320b are interdigitated.

Please still refer to FIG. 7. The first fishbone-shaped doped region 320a includes a first stem-like portion 322a and a plurality of first branch-like portions 324a while the first branch-like portions 324a are symmetrical about the first stem-like portion 322a. The first stem-like portions 322a are formed in the gap areas 308 and the first branch-like portions 324a extend into the memory cell area 306. The second fishbone-shaped doped region 320b includes a second stem-like portion 322b and a plurality of second branch-like portions 324b while the second branch-like portions 324b are symmetrical about the second stem-like portion 322b. The second stem-like portions 322b are formed in the gap areas 308 and the second branch-like portions 324b extend into the memory cell area 306. As shown in FIG. 7, the base portions 312 of the comb-like doped regions 310, the first stem-like portions 322a of the first fishbone-shaped doped regions 320a, and the second stem-like portions 322b of the second fishbone-shaped doped region 320b are parallel with each other. It is noteworthy that according to the present preferred embodiment, the tooth portions 314 of the comb-like doped region 310 and the first branch-like portions 324a of the first fishbone-shaped doped region 320a are alternately arranged, and the first branch-like portions 324a of the first fishbone-shaped doped region 320a and the second branch-like portion 324b of the second fishbone-shaped doped region 320b are alternately arranged. It is ensured that in the memory cell areas 306, the doped regions having the first conductivity type are all adjacent to the doped regions having the second conductivity type.

The layout configuration 300 for a memory cell array provided by the preferred embodiment further includes a plurality of n-type diffusion regions (not shown) respectively serving as the source/drain regions of the n-channel MOS transistor device formed in the tooth portions 314 of the comb-like doped regions 310, a plurality of n-type diffusion regions (not shown) respectively serving as the source/drain regions of the p-channel MOS transistor device formed in the first branch portions 324a of the first fishbone-shaped doped regions 320, and a plurality of p-type diffusion regions formed in the second branch-like portions 324b of the second fishbone-shaped doped regions 320b. Though those diffusion regions are omitted for simplifying the drawings and avoiding confusion, those skilled in the art should easily realize that those diffusion regions cannot be ignored from the memory cell array.

More important, the layout configuration 300 provided by the preferred embodiment further includes a plurality of first diffusion regions 316 formed in the base portions 312 of the comb-like doped regions 310. The first diffusion regions 316 include the second conductivity type. Also, the layout configuration 300 includes a plurality of second diffusion regions 326a formed in the second stem-like portions 322b of the second fishbone-shaped doped regions 320b and a plurality of third diffusion regions 326b formed in the first stem-like portions 324a of the first fishbone-shaped doped regions 320a. The second diffusion regions 326a include the second conductivity type and the third diffusion regions 326b include the first conductivity type. The first diffusion regions 316, the second diffusion regions 326a and the third diffusion regions 326b are all indicated as an area enclosed by a dotted line. It is noteworthy that the strap cells, which are provided for power feeding, include the first diffusion regions 316 for the n-channel MOS transistors, the second diffusion regions 326a for the n-channel MOS transistors, and the third diffusion regions 326b for the p-channel MOS transistors.

It is well-known that conventional homogenous memory cells are always interrupted by the strap cell in order to provide a required minimum potential for all cells in the memory cell areas 306, therefore the preferred embodiment provides the doped regions (the tooth portions 314, the first branch-like portions 324a, and the second branch-like portions 324b) in which the memory cells are produced and the doped regions (the base portions 312, the first stem-like portions 322a, and the second stem-like portions 322b) in which the strap cells are produced. Different from the prior art, the doped regions having the same conductivity are no longer islanding configurations, but are formed as a continuous configuration, such as the comb-like doped region 310, the first fishbone-shaped doped region 320a, and the second fishbone-shaped doped region 320b. Consequently, no spacing distance is needed anymore, and thus the memory cell array 300 provided by the present invention can be further shrunk. In the same time, since the diffusion regions 316/326a/326b are formed in the continuous configurations without spacing distance required. Thus the size of the diffusion regions 316/326a/326b can be enlarged as shown in FIG. 7. Consequently, ion implantation results for forming the diffusion regions 316/326a/326b are improved.

According to the layout configurations for a memory cell array provided by the present invention, the comb-like doped regions and the fishbone-shaped regions in which the memory cells and the strap cell are formed are provided. Specifically speaking, the strap cells are formed in the base portions of the comb-like doped regions and the stem-like portions of the fishbone-shaped doped regions while the memory cells are formed in the tooth portions of the comb-like doped regions and the branch-like portions of the fishbone-shaped regions. Therefore no spacing distance is needed between the doped regions for forming the strap cells and the doped regions for forming the memory cells. Accordingly the memory cell array provided by the present invention can be shrunk as expected.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A layout configuration for a memory cell array comprising:
   at least a comb-like doped region having a first conductivity type, the comb-like doped region comprising a plurality of tooth portions; and
   a fishbone-shaped doped region having a second conductivity type, the second conductivity type and the first conductivity type being complementary, the fishbone-shaped doped region comprising a plurality of branch-like portions parallel with the tooth portions of the comb-like doped region; wherein the comb-like doped region and the fishbone-shaped doped region are inter-digitated, and a distance between any two adjacent tooth portions of the comb-like doped region equals to a width of the branch-like portions of the fishbone-shaped doped region.

2. The layout configuration for a memory cell array according to claim 1, wherein the comb-like doped region further comprises a base portion.

3. The layout configuration for a memory cell array according to claim 2, further comprising a plurality of first diffusion regions formed in the base portion of the comb-like doped region.

4. The layout configuration for a memory cell array according to claim 3, wherein the first diffusion regions comprise the second conductivity.

5. The layout configuration for a memory cell array according to claim 2, wherein the fishbone-shaped doped region further comprises a stem-like portion.

6. The layout configuration for a memory cell array according to claim 5, wherein the base portion of the comb-like doped region and the stem-like portion of the fishbone-shaped doped region are parallel with each other.

7. The layout configuration for a memory cell array according to claim 5, further comprising a plurality of second diffusion regions formed in the stem-like portions of the fishbone shaped first doped region.

8. The layout configuration for a memory cell array according to claim 7, wherein the second diffusion regions comprise the first conductivity.

9. The layout configuration for a memory cell array according to claim 1, wherein the tooth portions of the comb-like doped region and the branch-like portions of the fishbone-shaped doped region are alternately arranged.

* * * * *